United States Patent [19]

Forouhi et al.

[11] Patent Number: 5,411,917
[45] Date of Patent: May 2, 1995

[54] ELECTRICALLY PROGRAMMABLE ANTIFUSE INCORPORATING DIELECTRIC AND AMORPHOUS SILICON INTERLAYER

[75] Inventors: Abdul R. Forouhi, San Jose; John L. McCollum, Saratoga; Shih-Oh Chen, Fremont, all of Calif.

[73] Assignee: Actel Corporation, Sunnyvale, Calif.

[21] Appl. No.: 4,912

[22] Filed: Jan. 19, 1993

Related U.S. Application Data

[63] Continuation of Ser. No. 604,779, Oct. 26, 1990, Pat. No. 5,181,096, which is a continuation-in-part of Ser. No. 508,306, Apr. 12, 1990, Pat. No. 5,070,384.

[51] Int. Cl.$^6$ ............................................. H01L 21/44
[52] U.S. Cl. ...................... 437/195; 148/DIG. 55; 257/50; 257/530; 257/355; 257/546
[58] Field of Search .................... 148/55; 437/195; 257/50, 530, 355, 546

[56] References Cited

U.S. PATENT DOCUMENTS

| | | | |
|---|---|---|---|
| 4,823,181 | 4/1989 | Mohsen et al. | 257/530 |
| 4,847,732 | 7/1989 | Stopper et al. | 257/50 |
| 4,914,055 | 4/1990 | Gordon et al. | 257/50 |
| 5,070,384 | 12/1991 | McCollum et al. | 357/51 |
| 5,171,715 | 12/1992 | Husher et al. | 437/195 |
| 5,181,096 | 1/1993 | Forouhi | 257/530 |
| 5,290,734 | 3/1994 | Boardman et al. | 148/55 |
| 5,308,795 | 5/1994 | Hawley et al. | 148/55 |

FOREIGN PATENT DOCUMENTS

| | | |
|---|---|---|
| 0162529 | 1/1985 | European Pat. Off. . |
| 0452091 | 4/1991 | European Pat. Off. . |
| 3927033 | 5/1989 | Germany . |
| 60-242678 | 5/1984 | Japan . |
| 8702827 | 5/1987 | WIPO ................ 257/530 |

Primary Examiner—Brian E. Hearn
Assistant Examiner—Lynne A. Gurley
Attorney, Agent, or Firm—D'Alessandro & Ritchie

[57] ABSTRACT

An antifuse may be fabricated as a part of an integrated circuit in a layer located above and insulated from the semiconductor substrate. The antifuse includes a lower first electrode, a first dielectric layer disposed over the lower first electrode, a layer of amorphous silicon disposed above the first dielectric layer, a second dielectric layer disposed above the amorphous silicon layer, and an upper second electrode disposed above the second dielectric layer.

21 Claims, 1 Drawing Sheet

ELECTRICALLY PROGRAMMABLE ANTIFUSE INCORPORATING DIELECTRIC AND AMORPHOUS SILICON INTERLAYER

RELATED APPLICATIONS

This application is a continuation of application Ser. No. 07/604,779, filed Oct. 26,1990, now U.S. Pat. No. 5,181,096, which is a continuation-in-part of application Ser. No. 07/508,306, filed Apr. 12, 1990, now U.S. Pat. No. 5,070,384.

BACKGROUND OF THE INVENTION

1. Field of the Invention

This invention relates to integrated electronic circuit technology. More particularly, this invention relates to electrically programmable antifuse elements.

2. The Prior Art

Integrated electronic circuits are usually fabricated with all internal connections set during the manufacturing process. However, because of high development costs and high manufacturing tooling costs of such circuits, it is advantageous if such circuits can be configured or programmed by the user for a specific application. Such circuits are called programmable circuits and are programmed by either selectively breaking or creating a, series of programmable links. Programmable links are electrical interconnects which are broken or created at selected electronic nodes in the circuit by the user after the integrated circuit device has been fabricated and packaged. Such programming is undertaken in order to activate or deactivate, respectively, the selected electronic nodes such that the PROM can be programmed to perform a desired function.

Fusible links have been used extensively in PROM devices and are well known. A PROM device usually consists of an X-Y matrix or lattice of conductors or semiconductors. At each cross-over point of the lattice, a conducting link connects a transistor or other electronic node to the lattice network. The PROM is programmed by providing a high programming current to predesignated fusible links which connect to selected nodes. Links are then blown out to create an open circuit. The combination of blown and unblown fusible links represents a digital bit pattern of ones and zeros signifying data which the user wishes to store in the PROM.

Fusible link PROM systems present certain disadvantages. For example, relatively high programming voltages and high current levels are needed during programming to guarantee the complete blowing out of the fusible links. Since the fusible link is usually conductive, excessive power dissipation may be necessary in order to blow out the link and thus program the device. Also, the shape and size of the fusible links must be very precisely controlled so that the link will function effectively as a conductor if it is not blown out. Conversely, the fusible link must be a completely open circuit if it is blown. Therefore, very critical photolithographic steps and controlled etched techniques are required during the manufacturing of fusible link PROMs. Such precise dimensional tolerances are difficult and expensive to attain. In addition, a large gap must be blown in the fusible link in order to prevent it from later closing by reason of the accumulation of conducting material near the blown gap. Accordingly, fusible link memory cells must be disadvantageously large in order to accommodate the fusible link and an associated selection transistor which develops the high current needed to blow the link. Fusible links therefore take up an excessively large amount of valuable space on a semiconductor chip and have high manufacturing and material costs.

Another type of programmable link, called an antifuse link, has been developed for use in integrated circuit applications in order to overcome the foregoing disadvantages of fusible links. Instead of a programming mechanism for causing an open circuit as is the case with the fusible link, the programming mechanism for an antifuse creates a short circuit or relatively low resistance link. Antifuse links consist typically of two conductor and/or semiconductor elements having some kind of a dielectric or insulating material between them. During programming, the dielectric at selected points between the conductive elements is broken down by a current developed from a predetermined programming voltage applied to the conductive elements of selected links to thereby electrically connect the conducting or semiconducting elements.

Various materials have been suggested for both the conducting elements and the dielectric or insulating layer. Some of these suggested dielectric materials require a relatively high current and voltage during programming and therefore demand complex manufacturing techniques. Such antifuse elements have low reliability during programming because it is difficult to control the reproducability of the conductive state due to the nature of the crystalline microstructures of the dielectric layer.

In addition, the programming process results in a link having a finite resistance on the order of several hundred to several thousand ohms. This characteristic of known antifuse elements renders them relatively unsuitable for use in high speed circuits. Such increased resistance results in high impedance and unacceptably high power consumption when several thousand circuits are switching simultaneously.

Prior art antifuse devices are typically one of two major types depending upon the dielectric or insulating material which comprises the interlayer disposed between the two conductive elements. Dielectric antifuses typically employ silicon dioxide or a multilayer sandwich of silicon dioxide and silicon nitride. Antifuse elements employing a dielectric interlayer are disadvantageous because they require programming voltages on the order of 16 to 20 volts in order to be programmed and still remain reliable at normal operating voltages of 5 volts. In order to program dielectric type antifuses so that they maintain reliable operation at 5 volts, the dielectric thickness must be on the order of 100 Å. Such a thin interlayer has the disadvantage of producing a relatively high capacitance. This can severely limit device operating speed because numerous unblown antifuses on a single line act as capacitors linked in parallel. The sum of the individual capacitances of the unblown antifuses therefore may be quite high and may drastically slow down data signals.

Another possible drawback of known dielectric antifuses containing silicon dioxide or a multilayer sandwich of silicon dioxide and silicon nitride is that a high temperature low pressure chemical vapor deposition (LPCVD) process must be used in order to deposit the thin oxide layer, or nitride layer with good uniformity and film controllability. However, the high temperature LPCVD process may have the disadvantage of inducing the formation of hillocks on the first metallic layer.

The hillock formations may extend through the 100 Å thin oxide and cause multiple short circuits between the first and second metallic layers, so it is advisable to avoid hillocks between metal layers.

The second type of prior art antifuse typically comprises an interlayer of amorphous silicon sandwiched between first and second layers of metal. The antifuses incorporating an amorphous silicon interlayer provide a thickness on the order of twenty times greater for the same programming voltage as compared to the dielectric antifuses with the 100 Å or less thin oxide or thin nitride layers. However, amorphous silicon antifuses have the disadvantage of extremely high leakage currents. The high leakage current inherent in the use of amorphous silicon can create a serious problem in terms of the controllability of the programming voltage. High leakage current can also cause severe storage time degradation in MOS devices. Thus, prior art amorphous silicon antifuses have serious programmability problems. In addition, an amorphous silicon antifuse may be prone to crack propagation and continuity failure after long hours of operation.

In order to overcome the foregoing disadvantages of prior art antifuses wherein the interlayer consists exclusively either of a dielectric or an amorphous silicon material, it is an object of the present invention to provide an electrically programmable low impedance antifuse which may be programmed with programming voltages of 18 volts or less in order to maintain reliable low impedance operation at standard MOS device operating voltage of 5 volts.

It is, yet a further object of the present invention to provide a antifuse element having a well-controlled programming voltage which will provide an improved degree of uniformity in the formation of the ohmic contact between the conducting elements and will advantageously require a lower programming voltage.

It is another object of the present invention to provide a plurality of electrically programmable antifuse elements with substantially reduced parasitic capacitance for use in a PROM device which will result in faster speed and greatly reduced power consumption when several thousand gates are switching simultaneously.

It is yet another object of the present invention to provide an electrically programmable antifuse element which substantially eliminates leakage currents, crack propagation and continuity failure inherent in a prior art amorphous silicon antifuse elements and thereby greatly improve the memory storage reliability and useful lifetime of a PROM device incorporating a plurality of antifuse elements. Other and further advantages of the present invention will appear hereinafter.

SUMMARY OF THE INVENTION

In order to overcome the above discussed disadvantages of known antifuse elements, an electrically programmable low impedance antifuse element is disclosed, a plurality of which may be integrated on a semiconductor substrate.

An antifuse according to the present invention may be fabricated as a part of an integrated circuit in a layer located above and insulated from the semiconductor substrate. The antifuse includes a lower first electrode, a first dielectric layer disposed over the lower first electrode a layer of amorphous silicon disposed above the first dielectric layer, a second dielectric layer disposed above the amorphous silicon layer, and an upper second electrode disposed above the second dielectric layer.

DETAILED DESCRIPTION OF THE PREFERRED EMBODIMENT

Figure 1:
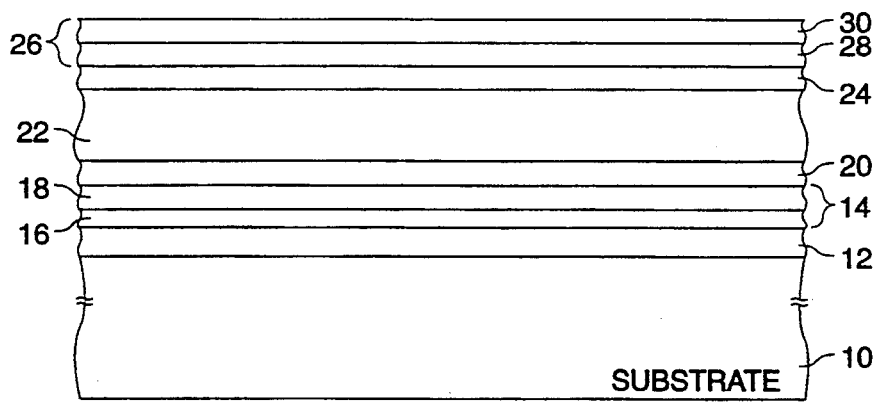
FIG. 1 is a cross section of an antifuse element according to a presently preferred embodiment of the invention.

The present invention is particularly useful for providing an antifuse structure for connecting together conductors disposed in adjacent metal layers of an integrated circuit.

Referring first to FIG. 1, a preferred embodiment of the present invention is fabricated on a semiconductor substrate 10. Those of ordinary skill in the art will readily recognize that semiconductor substrate 10 may in fact be a well region of one conductivity type fabricated in a semiconductor substrate of opposite conductivity type as is common in a CMOS process.

Disposed above semiconductor substrate 10 is a layer 12, which those of ordinary skill in the art will recognize to comprise all the thin film layers above the substrate necessary for the fabrication of the integrated circuit. As is common in CMOS processes, a BPSG or other passivation layer will be the topmost film in layer 12.

The first, or lower, electrode 14 of the antifuse of the present invention is first formed above layer 12 using conventional thin film processing techniques, and lies in contact with the passivation layer. Where necessary as described below, lower electrode 14 of the antifuse element may comprise a composite layer including a first adhesion-promoting layer 16 such as Ti, Cr and TiW, having a thickness of about 100 Å, covered by a conductive layer 18. Conductive layer 18 may comprise a metal, such as aluminum, a refractory metal such as tungsten, molybdenum, platinum, titanium, tantalum or silicides of those metals or arsenic-doped polysilicon.

Conductive layer 18 may have a thickness in the range of between about 1,000 Å and 10,000 Å, preferably from about 4,000 Å to 6,000 Å. One purpose of using an arsenic-polysilicon layer as lower electrode conductive layer 18 is to reduce the resistance of the antifuse if desired, as taught in U.S. Pat. No. 4,823,181 to Mohsen, et al. and co-pending application, Ser. No. 137,935, filed Dec. 28, 1987 and assigned to the same assignee as the present invention, both of which are expressly incorporated herein by reference. The arsenic dopant concentration should be somewhere on the order of $10^{20}$ atoms/cm$^3$.

In general, the first and second electrodes can be made of materials such as tungsten. However, as is well known by those of ordinary skill in the art, tungsten does not adhere well to oxides such as $SiO_2$, PSG, and BPSG. Thus, an adhesion promoting layer such as Ti, TiW or Cr, about 100 Å thick, should be deposited between the tungsten and any of such oxide layers.

Those of ordinary skill in the art will readily recognize that, where aluminum is utilized as the first and/or second electrode and it is in contact with a silicon layer, a barrier layer should be interposed between the two in order to avoid uncontrolled interdiffusion of Al and Si. Such a barrier layer can be TiW or TiN with a thickness of about between 500 Å and 1,550 Å.

After its formation, the composite lower electrode 14 may then be etched using conventional semiconductor processing techniques to provide both metal or other interconnects and lower electrodes for a plurality of antifuses according to the present invention.

A first dielectric layer 20 is next formed over the surface of lower electrode 14. In a presently preferred embodiment, first dielectric layer 20 is a layer of a generic silicon nitride $Si_xN_y:H$, produced by a CVD method such as PECVD or LPCVD. In a presently preferred embodiment, first dielectric layer 20 may have a thickness in the range of from between about 50 to 300 Å.

Those of ordinary skill in the art will recognize that other dielectric, materials, such as $Si_3N_4$, $SiO_2$, silicon oxynitride and suboxide of silicon ($SiO_x$) and other dielectric materials compatible with semiconductor processing techniques may be used for first dielectric layer 20, and depending on the material chosen for conductive layer 18, an adhesion promoting layer may be utilized if necessary.

Next, an antifuse layer 22 of doped or undoped silicon film, preferably produced by known CVD or sputtering techniques, is placed over the first dielectric layer 20. In a presently preferred embodiment, this antifuse layer 22 may be formed of hydrogenated amorphous silicon (a—Si:H), amorphous silicon (a—Si), or polycrystalline silicon, and may have a thickness in the range of about between 1,000 to 5,000 Å. If desired, antifuse layer 22 may be lightly doped with boron, phosphorus or arsenic to a level, for example, of about $1 \times 10^{14}$ atoms/cm$^3$ for the purpose of stabilizing the microstructure of the amorphous silicon.

Next, a second dielectric layer 24, similar to first dielectric layer 20, is formed on the surface of antifuse layer 22 using a CVD method such as PECVD or LPCVD. The materials used for second dielectric layer 24 may be any of the materials from which first dielectric layer 20 is formed. Dielectric layers 20 and 24 need not be made of the same material.

At various points in the process, the layers may be etched to define individual antifuses. For instance, after its formation, the antifuse layer 22 may then be etched using conventional semiconductor processing techniques to provide the desired structures for a plurality of antifuses according to the present invention. Finally, second, or upper, electrode 26 is formed over second dielectric layer 24 using conventional thin film deposition techniques. Like first electrode 14, second electrode 26 may be a composite of an adhesion-promoting layer 28 (if necessary as described above), such as Ti and TiW, having a thickness of about 100 Å, and a metal layer 30 as used for the first electrode, having a thickness in the range of from about 1,000 Å to 10,000 Å.

The employment of the composite interlayer comprising first and second dielectric layers 20 and 24 and antifuse layer 22 as disclosed herein enables the use of a process where the dielectric and antifuse layers 20, 22, and 24 can be sequentially deposited in the same CVD reactor or sputtering system without breaking the vacuum, thus increasing throughput and minimizing contamination. The employment of such a composite layer also has the advantage of substantially eliminating parasitic capacitances and leakage currents which are so common in prior art antifuse elements. The parasitic capacitance may be substantially eliminated because of the increased spacing between the lower and upper electrodes afforded by the composite dielectric and amorphous silicon interlayer.

It will be appreciated that antifuse layer 22 in combination with adjacent dielectric layers 20 and 24 also has the advantage of substantially eliminating defect densities such as crack propagation, continuity failure, and other structural defects which cause leakage currents since such defects would have to appear simultaneously at the same point in both the dielectric layers 20 and 24 and antifuse layer 22, a highly unlikely event. Thus, the novel combination of dielectric layers 20 and 24 and antifuse layer 22 interposed between them provides greatly enhanced antifuse reliability than is possible with most antifuse structures.

It is presently preferred to perform the deposition of both a—Si:H and $Si_xN_y:H$ at a temperature of about 380° C. although it is believed that the temperature may range from about 200–450° C. It is also presently preferred that the hydrogen content of the a—i:H be about 10%, although it is presently believed that ranges from about 5–40% will result in a functional antifuse. In addition, the composition of $Si_xN_y:H$ is preferably one in which x=3 and y=4, although silicon rich compositions are believed to be satisfactory. The preferred hydrogen content of the $Si_xN_y:H$ is about 10%, although it is presently believed that ranges from about 5–40% will result in a functional antifuse.

The antifuse of the present invention is programmed by applying a voltage between the first and second electrodes 14 and 26. The magnitude of the programming voltage necessary to program the antifuse of the present invention depends on several factors including the thicknesses of layers 20, 22, and 24, the hydrogen content of these layers, as well as Si to N ratios of layers 20 and 24. For example, an antifuse having 150 Å of PECVD silicon nitride for layers 20 and 24 and 2,000 Å of amorphous silicon for layer 22, all deposited at 380° C., will need about 12 volts to program it.

While a presently-preferred embodiment of the invention has been disclosed, those of ordinary skill in the art will, from an examination of the within disclosure and drawing be able to configure other embodiments of the invention. These other embodiments are intended to fall within the scope of the present invention which is to be limited only by the scope of the appended claims.

What is claimed is

1. A method for forming an electrically programmable, low impedance antifuse element on a semiconductor substrate comprising the steps of:
   forming an insulating layer over active circuit regions on said substrate,
   forming a first electrode over a selected portion of said insulating layer,
   forming a first dielectric layer immediately above said first electrode,
   forming an antifuse layer over said first dielectric layer,
   forming a second dielectric layer immediately over said antifuse layer,
   forming a second electrode over a selected portion of said second dielectric layer.

2. The method of claim 1 wherein said step of forming a first electrode includes the steps of:
   forming an adhesion-promoting layer over said insulating layer, and
   forming a first electrode layer over said adhesion-promoting layer.

3. The method of claim 1 wherein said step of forming a second electrode included the steps of:

forming an adhesion-promoting layer over said second dielectric layer, and forming a second electrode layer over said adhesion-promoting layer.

4. The method of claim 1 wherein said steps of forming a first and a second electrode include the steps of:

forming an adhesion-promoting layer over said insulating layer, and forming a first electrode layer over said adhesion-promoting layer; and forming an adhesion-promoting layer over said second dielectric layer, and forming a second electrode layer over said adhesion-promoting layer.

5. A method for forming an electrically programmable, low impedance antifuse element on a semiconductor substrate comprising the steps of:

forming an insulating layer over active circuit regions on said substrate, forming an adhesion-promoting layer over said insulating layer, forming a first electrode layer over said adhesion-promoting layer, forming a first dielectric layer over said first electrode, forming an antifuse layer over said first dielectric layer, forming a second dielectric layer over said antifuse layer, forming a second electrode over a selected portion of said second dielectric layer.

6. The method of claim 5 wherein said step of forming a second electrode includes the steps of:

forming an adhesion-promoting layer over said second dielectric layer, and forming a second electrode layer over said adhesion-promoting layer.

7. A method for forming an electrically programmable, low impedance antifuse element on a semiconductor substrate comprising the steps of:

forming an insulating layer over active circuit regions on said substrate, forming a first electrode over a selected portion of said insulating layer, forming a first dielectric layer over said first electrode, forming an antifuse layer over said first dielectric layer, forming a second dielectric layer over said antifuse layer, forming an adhesion-promoting layer over said second dielectric layer, and forming a second electrode layer over said adhesion-promoting layer.

8. The method of claim 7 wherein said step of forming a first electrode includes the steps of:

forming an adhesion-promoting layer over said insulating layer, and forming a first electrode layer over said adhesion-promoting layer.

9. A method for forming an electrically programmable, low impedance antifuse element on a semiconductor substrate comprising the steps of:

forming an insulating layer over active circuit regions on said substrate, forming an adhesion-promoting layer over said insulating layer, forming a first electrode layer over said adhesion-promoting layer, forming a first dielectric layer over said first electrode, forming an antifuse layer over said first dielectric layer, forming a second dielectric layer over said antifuse layer, forming an adhesion-promoting layer over said second dielectric layer, and forming a second electrode layer over said adhesion-promoting layer.

10. A method for forming an electrically programmable, low impedance antifuse element on a semiconductor substrate comprising the steps of:

forming an insulating layer immediately above active circuit regions on said substrate, forming a first electrode immediately above a selected portion of said insulating layer, forming a first dielectric layer immediately above said first electrode, forming an antifuse layer immediately above said first dielectric layer, forming a second dielectric layer immediately above said antifuse layer, forming a second electrode immediately above a selected portion of said second dielectric layer.

11. The method of claim 10 wherein said step of forming a first electrode includes the steps of:

forming an adhesion-promoting layer immediately above said insulating layer, and forming a first electrode layer immediately above said adhesion-promoting layer.

12. The method of claim 10 herein said step of forming a second electrode includes the steps of:

forming an adhesion-promoting layer immediately above said second dielectric layer, and forming a second electrode layer immediately above said adhesion-promoting layer.

13. The method of claim 10 wherein said steps of forming a first and a second electrode include the steps of:

forming an adhesion-promoting layer immediately above said insulating layer, and forming a first electrode layer immediately above said adhesion-promoting layer; and forming an adhesion-promoting layer immediately above said second dielectric layer, and forming a second electrode layer immediately above said adhesion-promoting layer.

14. A method for forming an electrically programmable, low impedance antifuse element on a semiconductor substrate comprising the steps of:

forming an insulating layer over active circuit regions disposed in said substrate, forming a first electrode over a selected portion of said insulating layer, forming a first dielectric layer over said first electrode, forming an antifuse layer over said first dielectric layer, forming a second dielectric layer immediately over said antifuse layer, forming a second electrode over a selected portion of said second dielectric layer.

15. The method of claim 14 wherein said step of forming a first electrode includes the steps of:

forming an adhesion-promoting layer over said insulating layer, and forming a first electrode layer over said adhesion-promoting layer.

16. The method of claim 14 wherein said step of forming a second electrode includes the steps of:

forming an adhesion-promoting layer over said second dielectric layer, and forming a second electrode layer over said adhesion-promoting layer.

17. The method of claim 14 wherein said steps of forming a first and a second electrode include the steps of:

forming an adhesion-promoting layer over said insulating layer, and forming a first electrode layer over said adhesion-promoting layer; and forming an adhesion-promoting layer over said second dielectric layer, and forming a second electrode layer over said adhesion-promoting layer.

18. A method for forming an electrically programmable, low impedance antifuse element on a semiconductor substrate comprising the steps of:

forming an insulating layer over active circuit regions on said substrate, forming a first electrode over a selected portion of said insulating layer, forming a first dielectric layer over said first electrode, forming an antifuse layer over said first dielectric layer, forming a second dielectric layer immediately above said antifuse layer, forming a second electrode over a selected portion of said second dielectric layer.

19. The method of claim 18 wherein said step of forming a first electrode includes the steps of:

forming an adhesion-promoting layer over said insulating layer, and forming a first electrode layer over said adhesion-promoting layer.

20. The method of claim 18 wherein said step of forming a second electrode includes the steps of:

forming an adhesion-promoting layer over said second dielectric layer, and forming a second electrode layer over said adhesion-promoting layer.

21. The method of claim 18 wherein said step of forming a first electrode include the steps of:

forming an adhesion-promoting layer over said insulating layer, and forming a first electrode layer over said adhesion-promoting layer; and forming an adhesion-promoting layer over said second dielectric layer, and forming a second electrode layer over said adhesion-promoting layer.

* * * * *

UNITED STATES PATENT AND TRADEMARK OFFICE
CERTIFICATE OF CORRECTION

PATENT NO. : 5,411,917
DATED : May 2, 1995
INVENTOR(S) : Abdul Rahim Forouhi, John L. McCollum, Shih-Oh Chen It is certified that error appears in the above-indentified patent and that said Letters Patent is hereby corrected as shown below:

Column 1, line 24, after "a" delete ",".

Column 3, line 32, after "is" delete ",

Column 6, line 17, replace "a-i:H" with --a-Si:H--.

Signed and Sealed this

Eleventh Day of June, 1996

BRUCE LEHMAN

*Attest:*

*Attesting Officer*     *Commissioner of Patents and Trademarks*